(12) United States Patent
Suenaga et al.

(10) Patent No.: US 8,058,779 B2
(45) Date of Patent: Nov. 15, 2011

(54) PIEZOELECTRIC THIN FILM ELEMENT

(75) Inventors: Kazufumi Suenaga, Tsuchiura (JP); Kenji Shibata, Tsukuba (JP); Fumihito Oka, Hitachi (JP); Hideki Sato, Hamamatsu (JP)

(73) Assignee: Hitachi Cable, Ltd., Tokyo (JP)

( * ) Notice: Subject to any disclaimer, the term of this patent is extended or adjusted under 35 U.S.C. 154(b) by 88 days.

(21) Appl. No.: 12/588,484

(22) Filed: Oct. 16, 2009

(65) Prior Publication Data

US 2010/0141099 A1    Jun. 10, 2010

(30) Foreign Application Priority Data

Dec. 8, 2008   (JP) .................. 2008-311972
May 11, 2009  (JP) .................. 2009-114122

(51) Int. Cl.
*H01L 41/187*   (2006.01)

(52) U.S. Cl. ....................................... 310/358

(58) Field of Classification Search ............ 310/358
See application file for complete search history.

(56) References Cited

U.S. PATENT DOCUMENTS

| 6,347,862 | B1 | 2/2002 | Kanno et al. | |
| 2006/0209128 | A1* | 9/2006 | Murai | 347/54 |
| 2007/0024162 | A1* | 2/2007 | Shibata et al. | 310/358 |
| 2007/0236104 | A1* | 10/2007 | Fujii | 310/358 |
| 2008/0012909 | A1* | 1/2008 | Matsuda et al. | 347/68 |

FOREIGN PATENT DOCUMENTS

| JP | 10-286953 | 10/1998 |
| JP | 2007-19302 | 1/2007 |

* cited by examiner

*Primary Examiner* — Derek Rosenau
(74) *Attorney, Agent, or Firm* — McGinn IP Law Group, PLLC

(57) ABSTRACT

A piezoelectric thin film element includes a bottom electrode, a piezoelectric layer and a top electrode on a substrate. The piezoelectric layer includes as a main phase a perovskite-type oxide represented by $(Na_xK_yLi_z)NbO_3$ ($0 \leq x \leq 1$, $0 \leq y \leq 1$, $0 \leq z \leq 0.2$, $x+y+z=1$), and the bottom electrode includes a surface roughness of not more than 0.86 nm in arithmetic mean roughness Ra or not more than 1.1 nm in root mean square roughness Rms.

13 Claims, 11 Drawing Sheets

FIG.1

- 4 PIEZOELECTRIC MATERIAL LAYER
- 3 BOTTOM ELECTRODE LAYER
- 2 BONDING LAYER
- 1 Si SUBSTRATE

- 5 TOP ELECTRODE
- 4 PIEZOELECTRIC LAYER
- 6 BASE LAYER
- 3 BOTTOM ELECTRODE LAYER
- 2 BONDING LAYER
- 1 Si SUBSTRATE

FIG.6

- 5
- 8 PIEZOELECTRIC LAYER
- 7 BASE LAYER
- 3
- 2
- 1

PIEZOELECTRIC THIN FILM ELEMENT

The present application is based on Japanese Patent Application Nos. 2008-311972 and 2009-114122 filed on Dec. 8, 2008 and May 11, 2009, respectively, the entire contents of which are incorporated herein by reference.

BACKGROUND OF THE INVENTION

1. Field of the Invention

The invention relates to a piezoelectric thin film element using a piezoelectric layer formed of lithium potassium sodium niobate etc.

2. Related Art

A piezoelectric material is processed into various piezoelectric elements in accordance with different purposes, particularly, it is widely used for functional electronic components such as an actuator for generating deformation by applying voltage or a sensor for generating voltage from the deformation of elements in a reverse way, etc.

As a piezoelectric material used for an actuator or a sensor, a lead-based dielectric material having large piezoelectric characteristics, especially, $Pb(Zr_{1-x}Ti_x)O_3$-based perovskite-type ferroelectric called PZT, has been widely used thus far, and the piezoelectric material is formed by sintering oxide which is generally formed of individual elements.

In addition, in recent years, it is desired to develop a piezoelectric material not containing lead from environmental consideration, and thus, lithium potassium sodium niobate (general formula: $(Na_xK_yLi_z)NbO_3$ (0<x<1, 0<y<1, 0<z<1, x+y+z=1), etc., has been developed. Since the lithium potassium sodium niobate has piezoelectric characteristics comparable to PZT, it is expected as a potential candidate for a lead-free piezoelectric material.

On the other hand, currently, downsizing and high performance are strongly demanded also in the piezoelectric element as downsizing and high performance in various electronic components progress. However, in a piezoelectric element produced by a manufacturing method mainly by a sintering process which is a conventional manufacturing method, especially when a thickness thereof becomes 10 μm or less, a dimension thereof comes close to that of a crystal grain composing a material, and influence cannot be ignored. Therefore, there arises a problem that variation or deterioration in characteristics becomes evident, and a method for forming a piezoelectric material by employing a thin-film technique etc., as an alternative to the sintering process is being researched in recent years in order to avoid such a problem.

Recently, a PZT thin film formed by a RF sputtering method has been put to practical use as an actuator for a high definition inkjet printer head or a compact and low cost gyro sensor (e.g., see JP-A 10-286953 and non-patent literary document of Kiyoshi Nakamura "High performance of piezoelectric material and advanced applied technologies" (in 2007) published by Science & Technology Co., Ltd). In addition, it has been proposed a piezoelectric thin film element using a lithium potassium sodium niobate not using lead (e.g., see JP-A 2007-19302).

It is possible to manufacture a inkjet printer head or a gyro sensor with small environmental burden by forming a lead-free piezoelectric thin film as a piezoelectric thin film. A basic research in thinning of lithium potassium sodium niobate is progressing as a concrete candidate for the lead-free piezoelectric thin film. However, it is difficult to reproducibly manufacture a piezoelectric thin film of lithium potassium sodium niobate having a large piezoelectric constant equivalent to that of PZT.

In addition, in order to reduce the cost in applications, it is essential to establish a technique to controllably form a lead-free piezoelectric thin film on a Si substrate or a glass substrate. When an actuator or a sensor is manufactured using a Si substrate or a glass substrate, it is required to provide electrodes on and under the piezoelectric thin film, however, since surface roughness of top/bottom electrodes and the piezoelectric thin film are rough and surface irregularities are large in the prior art, it is difficult to stably process into a predetermined shape or a surface state when a device is formed by applying a process, thus, there is a problem that a decrease in manufacturing yield occurs. In addition, since the irregularities on device surfaces are large, deterioration in aging characteristics occurs due to generation of leakage current or electric field intensity of a grain boundary portion of a piezoelectric material, and as a result, a decrease in piezoelectric constant or product lifetime occurs.

SUMMARY OF THE INVENTION

It is an object of the invention to provide a piezoelectric thin film element excellent in piezoelectric characteristics.

(1) According to one embodiment of the invention, a piezoelectric thin film element comprises a bottom electrode, a piezoelectric layer and a top electrode on a substrate, wherein the piezoelectric layer comprises as a main phase a perovskite-type oxide represented by $(Na_xK_yLi_z)NbO_3$ ($0 \leq x \leq 1$, $0 \leq y \leq 1$, $0 \leq z \leq 0.2$, x+y+z=1), and the bottom electrode comprises a surface roughness of not more than 0.86 nm in arithmetic mean roughness Ra or not more than 1.1 nm in root mean square roughness Rms.

In the above embodiment (1), the following modifications and changes can be made.

(i) The bottom electrode comprises a (111) preferential orientation in a direction perpendicular to the substrate.

(ii) The bottom electrode comprises a bonding layer on the substrate and an electrode layer on the bonding layer, and the bonding layer comprises a Ti film of not less than 0.084 nm and not more than 10 nm in thickness.

(iii) The piezoelectric layer formed on the bottom electrode comprises a maximum-minimum surface roughness of not more than 23% with respect to an average film thickness of the piezoelectric layer.

(iv) The piezoelectric layer formed on the bottom electrode comprises an arithmetic mean surface roughness Ra or root mean square surface roughness Rms of not more than 2.7% with respect to an average film thickness of the piezoelectric layer.

(v) The piezoelectric layer comprises a surface roughness of not more than 4.1 nm in arithmetic mean roughness Ra, not more than 4.8 nm in root mean square roughness Rms, or not more than 137.7 nm in maximum-minimum roughness.

(vi) The piezoelectric layer comprises a part of an $ABO_3$ crystal layer, an $ABO_3$ amorphous layer, or a mixed layer comprising a crystal and an amorphia of $ABO_3$, where A comprises at least one element selected from Li, Na, K, Pb, La, Sr, Nd, Ba and Bi, B comprises at lest one element selected from Zr, Ti, Mn, Mg, Nb, Sn, Sb, Ta and In, and O is oxygen.

(vii) The piezoelectric layer comprises a (001) preferential orientation in a direction perpendicular to the substrate.

Points of the Invention

A bottom electrode in crystalline state is oriented to a (111) plane as a closest-packed plane of atoms when its crystal structure is a cubic crystal as in Pt etc. A lithium potassium sodium niobate film formed on the Pt bottom electrode in crystalline state is therefore oriented to a (001) plane based on the structure of a crystal surface exposed to the surface of the Pt bottom electrode, so that it can be significantly improved in surface flatness. As a result, a piezoelectric thin film element can be excellent in piezoelectric characteristics since the surface flatness can be improved by controlling the surface roughness of the bottom electrode.

BRIEF DESCRIPTION OF THE DRAWINGS

Next, the present invention will be explained in more detail in conjunction with appended drawings, wherein.

DESCRIPTION OF THE PREFERRED EMBODIMENT

An embodiment of the piezoelectric thin film element of the invention will be explained as follows.

The piezoelectric thin film element in the present embodiment has a substrate, an oxide film formed on a surface of the substrate, a bottom electrode formed on the oxide film, a perovskite-type piezoelectric layer formed on the bottom electrode, and a top electrode formed on the piezoelectric layer.

A main phase of the piezoelectric layer is a perovskite-type oxide represented by $(Na_xK_yLi_z)NbO_3$ ($0 \leq x \leq 1$, $0 \leq y \leq 1$, $0 \leq z \leq 0.2$, $x+y+z=1$) and the substrate is a Si substrate.

Furthermore, surface roughness of the bottom electrode is either 0.86 nm or less in arithmetic mean roughness Ra or 1.1 nm or less in root mean square roughness Rms.

A Si substrate is preferable as the above-mentioned substrate because of its low cost and industrial accomplishments, however, it is possible to use a MgO substrate, a $SrTiO_3$ substrate, a $SrRuO_3$ substrate, a glass substrate, a silica substrate, a GaAs substrate, a GaN substrate, a sapphire substrate, a Ge substrate or a stainless substrate, etc., besides the Si substrate.

The oxide film formed on the surface of the Si substrate includes a thermal oxide film formed by thermal oxidation and a Si oxide film formed by a CVD (Chemical Vapor Deposition) method, etc. Alternatively, for an oxide substrate such as silica glass, MgO, $SrTiO_3$ or $SrRuO_3$, etc., a bottom electrode such as a Pt electrode may be directly formed without forming the oxide film on the substrate.

The bottom electrode is preferably an electrode layer formed of Pt or an alloy consisting of mainly Pt, or, an electrode layer having a laminated structure thereof. In addition, it is preferable that the bottom electrode is formed preferentially orienting to a (111) plane direction in a direction perpendicular to the substrate. A bonding layer (adhesion layer) such as Ti, etc., for enhancing adhesion with the substrate may be provided between the substrate and the electrode layer formed of Pt or an alloy consisting of mainly Pt.

On the surface of the bottom electrode such as Pt, etc., which is preferentially oriented to a desired direction such as a (111) plane, etc., a shape for accelerating smoothing is realized. As a result of measuring surface roughness of the Pt bottom electrode by an Atomic Force Microscopy (AFM), at least one or more of any of a portion of 0.86 nm or less in arithmetic mean roughness, a portion of 1.1 nm or less in root mean square roughness and a portion of 11.5 nm or less in maximum-minimum roughness are present in an observation range of 1 μm square. Alternatively, surface irregularities may be measured by a SEM (scanning electron microscope) or a TEM (transmission electron microscope).

The piezoelectric layer may be a piezoelectric layer of which main phase is a perovskite-type oxide represented by $(Na_xK_yLi_z)NbO_3$ ($0 \leq x \leq 1$, $0 \leq y \leq 1$, $0 \leq z \leq 0.2$, $x+y+z=1$) and, for example, a predetermined amount of Ta (tantalum) or V (vanadium) may be doped to potassium sodium niobate or lithium potassium sodium niobate within a range not losing the piezoelectric characteristics or the surface roughness. The piezoelectric layer is formed using the RF sputtering method.

In the meantime, when the bottom electrode is formed on the substrate such as a Si substrate without considering about lattice match with a lithium potassium sodium niobate film (including a case of a potassium sodium niobate film) and the lithium potassium sodium niobate film is formed on an upper portion thereof, a polycrystalline thin film is formed. Since it is conventionally formed without taking into consideration of crystal orientation, the lithium potassium sodium niobate film is formed as a random-oriented polycrystalline thin film.

In addition, the film is conventionally formed without considering about a size of surface irregularities of the bottom electrode which is a base of the piezoelectric thin film. Therefore, the surface irregularities of the lithium potassium sodium niobate film are very large. The reason thereof is considered that plane direction dependence of a crystal growth rate affects the formation of the piezoelectric thin film and that a growth direction of the piezoelectric thin film formed on the upper portion of the bottom electrode becomes random due to the large irregularities on the surface of the bottom electrode.

Therefore, firstly, it was examined to manufacture a polycrystalline thin film having uniaxial orientation so that a surface of the lithium potassium sodium niobate film faces the same plane direction. As a method thereof, on the upper portion of the bottom electrode as a base which is not in amorphous state but in a crystalline state, the lithium potassium sodium niobate film is formed.

The bottom electrode in the crystalline state is oriented to a (111) plane as a closest-packed plane of atoms when its crystal structure is a cubic crystal as in Pt etc. For example, in case of forming a film of Pt on a substrate at a room temperature, a Pt thin film in the amorphous state is formed, however, in case of forming a film by heating the substrate using a sputtering method, a Pt thin film in the crystalline state preferentially orienting to (111) is formed. The lithium potassium sodium niobate film formed on the Pt bottom electrode in the crystalline state becomes a state oriented to a (001) plane based on a structure of a crystal plane exposed to the surface of the Pt bottom electrode, which results in a significant improvement in surface flatness.

Next, it was examined to planarize the surface of the bottom electrode to be a base such as Pt, etc., so that the lithium potassium sodium niobate film grows in one direction. One of a method for planarizing the surface of the bottom electrode such as Pt, etc., is a method in which the surface irregularities of a bottom electrode layer is decreased by strictly controlling a film thickness of the bottom electrode.

In addition, another method for planarizing the surface of the bottom electrode such as Pt, etc., is a method in which a bottom electrode layer such as polycrystalline Pt, etc., is formed by controlling crystal grain size thereof to be uniform, thereby planarizing the surface of the bottom electrode layer.

As a result of planarizing the surface of the bottom electrode layer, surface flatness is significantly improved in the lithium potassium sodium niobate film formed on the upper portion of the bottom electrode.

A method for decreasing the surface irregularities of a bottom electrode layer by strictly controlling a film thickness of the bottom electrode is as follows.

In case of a sputtering film formation method, a film formation rate is increased or decreased by changing an input power, the film thickness is increased or decreased in the film formation for a certain time, and it is thereby possible to control the film thickness. In addition, the same effect is obtained by increasing and decreasing pressure of Ar which is a film formation action gas used for sputtering. When the film thickness of the polycrystalline film such as Pt, etc., is increased (when growth time is extended), many crystal grains which are abnormally grown are scattered in the film, furthermore, crystal grain size thereof is increased. As a result, since large and small crystal grains exist together in spots, a concavo-convex shape on the surface of the Pt becomes large. In order to realize a bottom electrode in a state that the abnormally grown crystal grain does not exist locally at all or in a state that the size of the abnormally grown crystal grain is small, it is possible to planarize by strictly controlling the film thickness (in this case, by decreasing the film thickness).

In addition, the bottom electrode such as Pt, etc., is intermittently formed in multiple stages, i.e., formed as a multilayer film of a thin film. As a result, an intermittent film formation, in which the film formation is suspended once before the abnormal growth of the Pt crystal grains becomes significant and a film is substantially formed again, is repeated for gradually laminating, and it is thereby possible to ensure uniformity of the film thickness. Furthermore, by rotating and revolving the substrate on which the bottom electrode is formed during the film formation, it is possible to decrease distribution of the film thickness of Pt, etc., and to control a film thickness distribution. Alternatively, in case of forming a film by the sputtering method, a raw-material target side may be rotated and revolved. Also, it is possible to control the film thickness by carrying out a machining process such as grinding or polishing, a chemical mechanical polishing called CMP, or sputtering etching by Ar ions, etc., with respect to the surface of the bottom electrode having a nonuniform film thickness.

In addition, a method for planarizing the surface of the bottom electrode by forming a bottom electrode such as polycrystalline Pt, etc., by strictly controlling crystal grain size thereof to be uniform is as follows.

By the film formation that orientations of each crystal grain are aligned so that the thin film of Pt, etc., is highly oriented to a (111) plane direction, it is possible to suppress influences such as local abnormal growth of the crystal grain or extension of inter-grain boundaries caused by growth of the crystal grain in random directions. As a result, the crystal grain size becomes uniform and the surface of the bottom electrode is planarized. Similarly to the method for achieving high orientation, it is effective to form the Ti bonding layer (adhesion layer) to be a base in a film thickness of 10 nm or less for controlling uniformity of the crystal grain size, preferably, in a film thickness of 2.1 nm or less. It is desirable to form a thin bonding layer of at least about 1 atomic layer for high planarization, thus, a lower limit of the Ti bonding layer is determined to be 0.084 nm. Furthermore, it is efficient to set a Pt film formation temperature to 200° C. or more which is higher than a room temperature. In addition, a several nm thick seed layer formed of Pt or an alloy composition containing Pt which is a core of each Pt crystal grain is formed as a base of the bottom electrode, the bottom electrode is formed thereon, and it is thereby possible to grow uniform Pt crystal grains.

In order to improve an oriented state of the lithium potassium sodium niobate film, in the above-mentioned embodiment, an orientation control layer for improving the orientation of the piezoelectric layer may be provided between the bottom electrode and the piezoelectric layer.

It is preferable that the orientation control layer is $LaNiO_3$, $LaAlO_3$, $SrTiO_3$, $SrRuO_3$, $La_{0.6}Sr_{0.4}FeO_3$, $La_{0.6}Sr_{0.4}CoO_3$, $KNbO_3$, $NaNbO_3$ and a solid solution thereof, or a laminated body containing any of them. For example, when the orientation control layer which is likely to align on (001) such as $LaNiO_3$ is formed and the lithium potassium sodium niobate thin film is formed on the upper portion thereof, it becomes easy to obtain the lithium potassium sodium niobate thin film preferentially oriented to (001).

It is possible to manufacture a piezoelectric device such as various actuators or sensors, or a compact apparatus, e.g., a MEMS (micro electro mechanical system) by forming the piezoelectric thin film element in the above-mentioned embodiment in a predetermined shape and providing voltage application means or voltage detecting means. By the planarization of the bottom electrode or a piezoelectric thin film, it is possible to realize improvement or stabilization of piezoelectric characteristics of the piezoelectric thin film element or the piezoelectric device using the piezoelectric thin film element and also to improve manufacturing yield, and it is thereby possible to provide a high performance micro device at low cost.

EXAMPLES

Examples of the invention and Comparative Examples will be explained below.

Example 1

Figure 1:
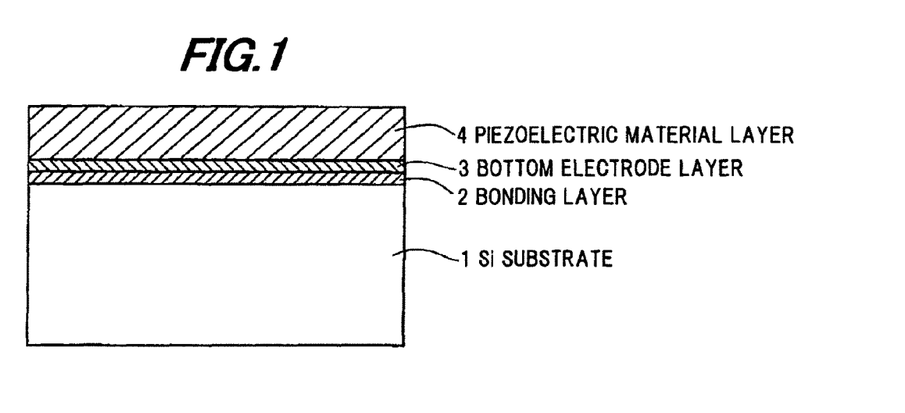
FIG. 1 is a schematic cross view showing a substrate with a piezoelectric thin film in Example 1 of the invention.

FIG. 1 is a schematic cross sectional view showing a substrate with a piezoelectric thin film in Example 1. In Example 1, a substrate with a piezoelectric thin film was manufactured in which a bonding layer 2 was formed on a Si substrate 1 having an oxide film, and a bottom electrode layer 3 and a piezoelectric layer 4 of potassium sodium niobate (herein referred to as "KNN") having a perovskite structure are formed on the bonding layer 2. A manufacturing method thereof will be explained below.

Firstly, a thermal oxide film (illustration omitted) was formed on a surface of the Si substrate 1, then, a bottom electrode was formed on the thermal oxide film. In the present Example, the bottom electrode is composed of a 2.0 nm thick Ti film formed as the bonding layer 2 and a 200 nm thick Pt thin film formed as the bottom electrode layer 3 on the Ti film. The sputtering method was used for forming the Ti film and the Pt thin film. For forming the Pt thin film, a Pt metal target was used as a sputtering target and a 100% Ar gas was used for a sputtering gas. At the time of the film formation, sputtering input power was 75 W, a substrate temperature was set to 300° C. and a film was formed 200 nm thick, thereby forming a Pt thin film which is a polycrystalline thin film of Example 1. In addition, as Comparative Example 1, a Pt thin film was made under the completely same film formation condition except that the substrate heating temperature was changed to 700° C.

The surface irregularities of the Pt thin film as the bottom electrode layer 3 was examined by an AFM (Atomic Force Microscopy). For the measurement, the AFM with a probe tip having a curvature radius of 1 nm was used, and the surface roughness was analyzed by scanning at 4 nm pitch in a range of 1 μm×1 μm. As for the arithmetic mean roughness Ra, the root mean square roughness Rms and the maximum-minimum roughness (which corresponds to maximum height defined by JIS B0601) of the surface roughness here, the surface roughness were estimated by following method against the measured surface concavo-convex shape (a curved surface) (it is the same for the below described KNN film). The surface roughness are shown as a standard deviation of a maximum value and a minimum value of the entire data of the irregularities measured by the AFM.

The following formula (1) is a definitional equation of the root mean square surface roughness Rms (the length unit is run). In addition, the following formula (2) is a definitional equation of the three dimensional arithmetic mean surface roughness Ra (the length unit is nm) against a center plane (volume formed by the plane surface and the surface shape is equal above and below the plane. The detail is described in "Large-sized Sample SPM Observation System Operation Guide" (April, 1996) published by Toyo Corporation.

Formula 1

$$Rms = \sqrt{\frac{\sum_{i=1}^{N}(z_i - z_i(ave))^2}{N}} \quad (1)$$

Here, N is the number of data measurement points, zi is a height of the measurement point i, zi(ave) is an average value of zi, and Rms is root mean square surface roughness.

Formula 2

$$Ra = \frac{1}{LxLy} \int_0^{Lx} \int_0^{Ly} f(x,y) dx dy \quad (2)$$

Here, Lx is a dimension of a surface in an x direction, Ly is a dimension of the surface in a y direction, f(x,y) is a roughness curved surface with respect to the center plane, and Ra is arithmetic mean surface roughness.

Figure 3A:
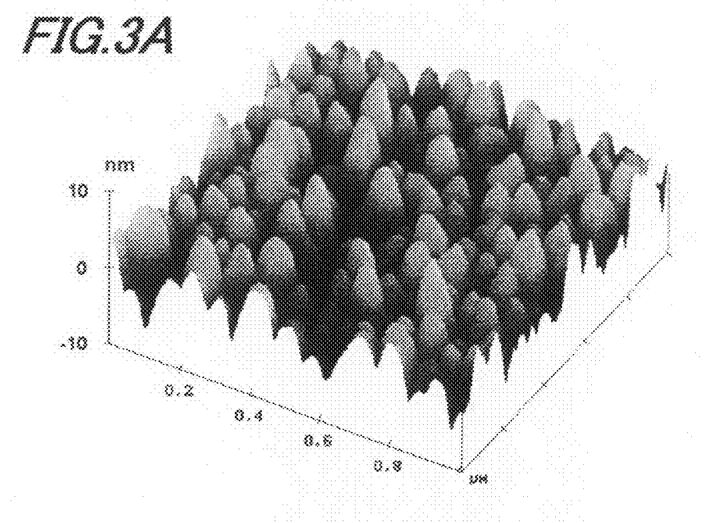
FIGS. 3A and 3B are AFM observation images showing surfaces of Pt bottom electrodes in Example 1 and Comparative Example 1 observed by an AFM.
Figure 3B:
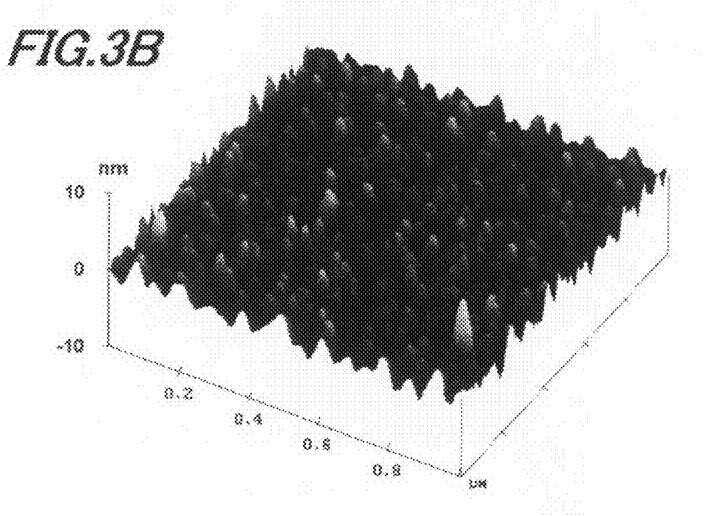

FIG. 3B is an AFM observation image showing a surface of the Pt bottom electrode layer 3 in Example 1. In the Pt bottom electrode layer in Example 1, the arithmetic mean roughness Ra, the root mean square roughness Rms and the maximum-minimum roughness Rmax, which are analytic values of the surface shape thereof, are respectively 0.83 nm, 1.1 nm and 11.5 nm. In addition, FIG. 3A is an AFM observation image showing a surface of a Pt bottom electrode layer in Comparative Example 1. In the Pt bottom electrode layer in Comparative Example 1, the surface roughness is larger than that in Example 1, and the arithmetic mean roughness Ra, the root mean square roughness Rms and the maximum-minimum roughness of the surface were respectively 2.0 nm, 2.5 nm and 16.7 nm. Alternatively, the surface irregularities can be further reduced by decreasing the film thickness of the Pt thin film to 200 nm or less.

Next, KNN thin films as the piezoelectric layer 4 were formed on a Si substrate with a Pt electrode in Example 1 and Comparative Example 1. The sputtering method was used also for forming the KNN thin film. For forming the KNN thin film, the substrate was heated at 600° C. and the sputtering was performed by plasma using a mixed gas of Ar+O$_2$ (a mixture ratio of Ar:O$_2$=9:1). A sintered body target of (Na$_x$K$_y$Li$_z$)NbO$_3$ (x=0.5, y=0.5 and z=0) was used for a target. The film formation was performed at 100 W of RF output until the film thickness becomes 3 μm.

Figure 2:
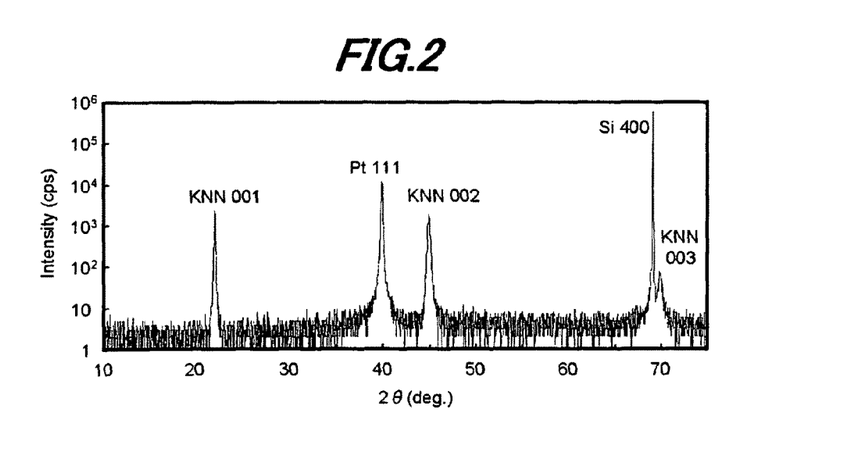
FIG. 2 is a view showing an X-ray diffraction pattern of the substrate with the piezoelectric thin film in Example 1.

As a result of examining a crystal structure of the thus formed KNN film by an X-ray diffractometer, it was found that the Pt thin film in Example 1 formed by heating the substrate at 300° C. was oriented to a Pt (111) plane in a direction perpendicular to the surface of the Si substrate 1, as shown in the X-ray diffraction pattern of FIG. 2 (scan measurement of 2θ/θ). In addition, it was found that the KNN film formed on the Pt film oriented to the Pt (111) plane in Example 1 is strongly oriented to KNN (001), as shown in FIG. 2.

In Comparative Example 2 in which the Pt thin film was formed at a room temperature without heating the substrate, it was confirmed that, as a result of examining the Pt thin film by X-ray diffraction measurement, diffraction form the specific crystal surface does not exist and the Pt thin film is in an amorphous state. In addition, it was found that orientation is not present in the KNN film formed on the Pt film in Comparative Example 2 which was formed at a room temperature, and the KNN film was a random polycrystalline film.

Next, the surface irregularities on the piezoelectric layer 4 of the KNN films formed on the bottom electrode layer 3 having different surface irregularities in Example 1 and Comparative Example 1 was visually observed, and it was confirmed that the KNN film formed on the Pt electrode having large surface irregularities in Comparative Example 1 has a white turbidity like opaque pattern on a surface thereof. On the other hand, the surface of the KNN film formed on the Pt electrode having small surface irregularities in Example 1 was in a clear mirror surface condition.

Figure 4A:
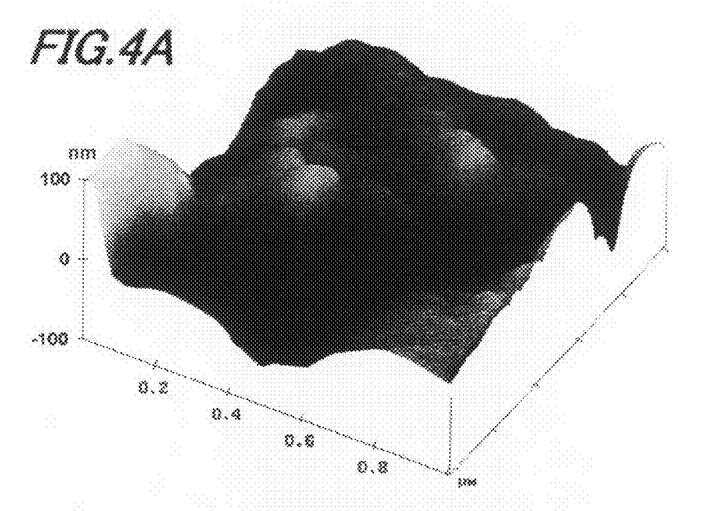
FIGS. 4A and 4B are AFM observation images showing surfaces of KNN piezoelectric thin films in Example 1 and Comparative Example 1 observed by an AFM.
Figure 4B:
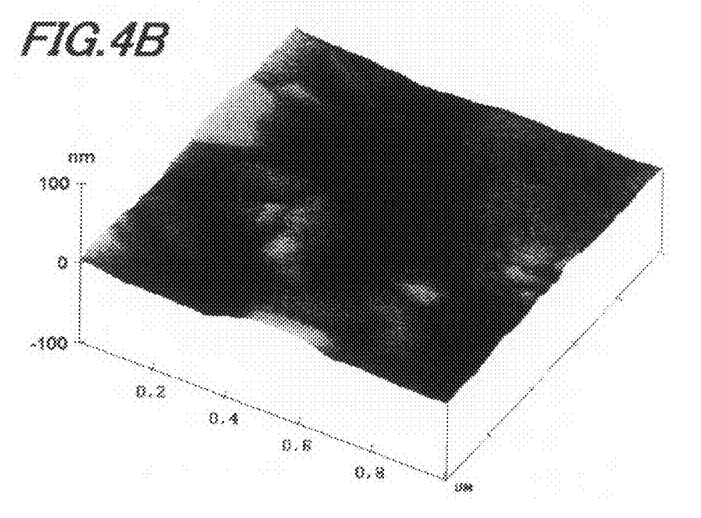

Furthermore, the surface irregularities of the two KNN films were examined by the AFM. Similarly to the Pt bottom electrode, the surface roughness was derived by measuring at 4 nm pitch in an area of 1 μm×1 μm. FIG. 4A is an AFM observation image showing a surface of the KNN film in Comparative Example 1. In addition, FIG. 4B is an AFM observation image showing a surface of the KNN film in Example 1.

From the above analysis result, as for the KNN film formed on the upper portion of the Pt electrode having large surface irregularities in Comparative Example 1, the values of the arithmetic mean roughness Ra, the root mean square roughness Rms and the maximum-minimum roughness Rmax were respectively 21 nm, 28 nm and 199 nm. In contrast, as for the KNN film formed on the upper surface of the Pt electrode having small surface irregularities in Example 1, the arithmetic mean roughness Ra, the root mean square roughness Rms and the maximum-minimum roughness Rmax of the surface were respectively 4.0 nm, 3.2 nm and 28 nm.

From this analysis result, it was found that it is possible to significantly planarize a surface condition of the KNN film by crystallizing the Pt bottom electrode so as to orient to a (111) plane, decreasing the surface irregularities of the Pt bottom electrode and forming the KNN film on an upper portion thereof.

In addition, composition of a sintered body sputtering target was changed and examined, and it was found that the surface condition of the piezoelectric thin film was significantly planarized in the same manner when $(Na_xK_yLi_z)NbO_3$ is in a range of $0 \leq x \leq 1$, $0 \leq y \leq 1$, $0 \leq z \leq 0.2$ and $x+y+z=1$, and there were at least one or more portions which meet any of a portion in which the arithmetic mean roughness Ra of the surface is 4.1 nm or less, a portion in which the root mean square roughness Rms is 4.8 nm or less and a portion in which the maximum-minimum roughness Rmax is 137.7 nm or less. Furthermore, the result was the same in the case where Ta was doped to the above-mentioned target.

Example 2

Figure 5:
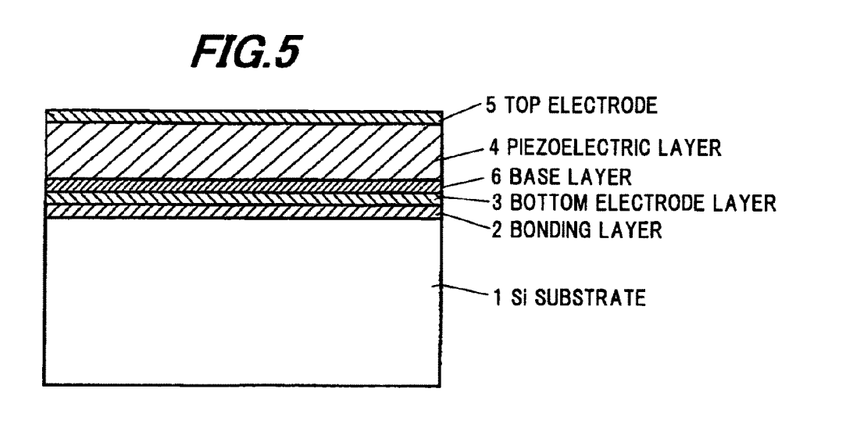
FIG. 5 is a schematic cross view showing a piezoelectric thin film element in Example 2 of the invention.

FIG. 5 is a cross sectional view showing a piezoelectric thin film element in Example 2. In Example 2, a piezoelectric thin film element was made in which a bottom electrode layer 3, a base layer 6 as an orientation control layer for improving the orientation of the KNN film, a piezoelectric layer 4 of the KNN film and a top electrode 5 are formed on an upper portion of the bonding layer 2 which is formed on the Si substrate 1 having an oxide film.

Similarly to Example 1, the bottom electrode layer 3 of the Pt thin film was formed on the Si substrate 1 via the bonding layer 2 of the Ti film, and the bottom electrode layer 3 was crystallized, oriented to Pt (111) and planarized. Next, on the Pt bottom electrode layer 3, a $LaNiO_3$ (lanthanum nickel oxide; LNO) film was formed as the base layer 6. The LNO film is easily oriented to a (001) plane on the Pt (111) plane. The LNO film was formed also using the sputtering method. A mixed gas of $Ar+O_2$ (a mixture ratio of $Ar:O_2=9:1$) was used as a sputtering gas. The film is formed 200 nm thick at 75 W of RF power. When the X-ray diffraction measurement was carried out on the LNO film, it was found that the LNO film is independently oriented to LNO (001).

The piezoelectric layer 4 of the KNN film was formed on the base layer 6 of the LNO film. The formation condition was the same as that of Example 1. As a result of evaluating the oriented state of the thus formed KNN film by using an X-ray diffractometer, it was found that the thus formed KNN film is strongly oriented to KNN (001) than to that formed in Example 1.

In addition, the surface irregularities of the KNN film were evaluated using the AFM. The AFM with a probe tip having a curvature radius of 1 nm or more was used, and the surface roughness was calculated by measuring at 20 nm pitch in an area of 10 μm×10 μm. As a result, it was found that the arithmetic mean roughness Ra, the root mean square roughness Rms and the maximum-minimum roughness Rmax were respectively 3.0 nm, 3.8 nm and 46.8 nm and the mirror condition became good. From this result, it was found that it is possible to planarize by orienting the KNN film.

Next, the top electrode 5 was formed on the piezoelectric layer 4 of the formed KNN film. Al (aluminum) was selected for a material of the top electrode 5 and a vacuum deposition method was used for the formation. The surface irregularities were evaluated also for the top electrode 5. As a result, it was found that the arithmetic mean roughness Ra, the root mean square roughness Rms and the maximum-minimum roughness Rmax of the surface were respectively 3.0 nm, 3.6 rim and 40.2 nm and the top electrode 5 was sufficiently flat. From this result, it was confirmed that the surface of the top electrode 5 formed on the upper portion of the flat piezoelectric layer 4 has the substantially same flatness as the piezoelectric layer 4.

Next, when composition of a sputtering target was changed and examined, it was found that the surface condition became a mirror surface in the same manner when $(Na_xK_yLi_z)NbO_3$ is in a range of $0 \leq x \leq 1$, $0 \leq y \leq 1$, $0 \leq z \leq 0.2$ and $x+y+z=1$, and there were at least one or more portions, which meet any of a portion in which the arithmetic mean roughness Ra of the surface is 4.1 nm or less, a portion in which the root mean square roughness Rms is 4.8 nm or less and a portion in which the maximum-minimum roughness Rmax is 137.7 nm or less.

Example 3

Figure 6:
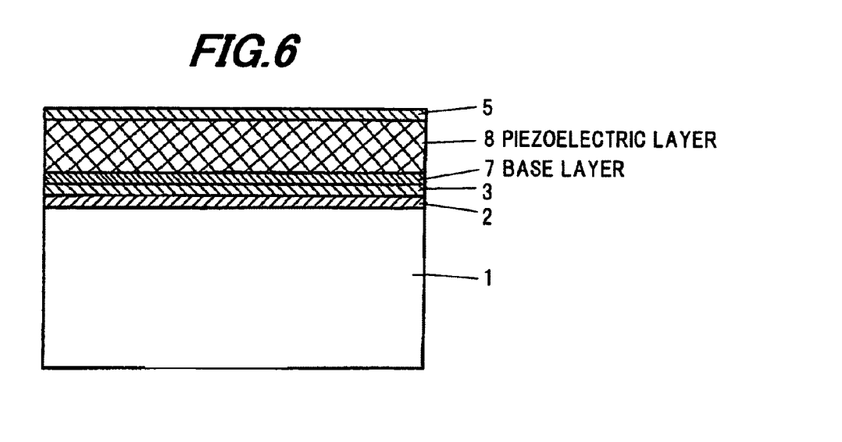
FIG. 6 is a schematic cross view showing a piezoelectric thin film element in Example 3 of the invention.

FIG. 6 is a cross sectional view showing a piezoelectric thin film element in Example 3. In Example 3, a piezoelectric thin film element was made in which a bottom electrode layer 3, a base layer 7 of sodium niobate, a piezoelectric layer 8 of lithium potassium sodium niobate and a top electrode 5 are formed on an upper portion of the bonding layer 2 which is formed on the Si substrate 1 having an oxide film.

In Example 3, an effect of using a base layer (an orientation control layer) different from $LaNiO_3$ of the above-mentioned Example 2 was examined. Sodium niobate ($NaNbO_3$) was used as the base layer 7. In addition, in Example 3, lithium potassium sodium niobate (($Na_xK_yLi_z)NbO_3$, herein referred to as "LKNN"), which is lithium-doped KNN, was used as the piezoelectric layer 8. Although LKNN is composed of five elements, which are lithium (Li), potassium (K), sodium (Na), niobium (Nb) and oxygen (O), since inside of a chamber for performing the sputtering could not be contaminated by a substance other than a component of the piezoelectric layer 8 if sodium niobate ($NaNbO_3$) not containing lithium or potassium is used as the base layer 7 among them, it is possible to form the piezoelectric layer 8 using the same chamber as that of the base layer 7, and it is thereby possible to continuously form the base layer 7 and the piezoelectric layer 8.

Firstly, a substrate with a Pt film which is the same as that of Example 2 was prepared, and then, the base layer 7 of sodium niobate was formed on an upper portion of the bottom electrode layer 3. The sputtering method was used for forming the base layer 7. The base layer 7 was formed 200 nm thick at 100 W of RF power by using an Ar+$O_2$ mixed gas (a mixture ratio of Ar:$O_2$=8.5:1.5) as a sputtering gas. The sodium niobate film thus formed was evaluated by the X-ray diffractometer, and it was found that the film is preferentially oriented to a (001) plane.

Next, the piezoelectric layer 8 of the LKNN film was formed on the base layer 7 of sodium niobate film. The sputtering method was used for forming the LKNN film. The substrate was heated at 600° C. during the film formation and the sputtering was performed by plasma using a mixed gas of Ar+$O_2$ (a mixture ratio of Ar:$O_2$=9:1). A sintered body target of $(Na_xK_yLi_z)NbO_3$ (x=0.48, y=0.48 and z=0.04) was used for a target. The film formation was performed at 100 W of RF output until the film thickness becomes 3 μm.

A crystalline property of the LKNN film thus formed was evaluated using the X-ray diffractometer, and it was found that the LKNN film is oriented to two planes, which are (110) and (001) planes. The surface irregularities of the specimen were evaluated using the AFM. For the evaluation, the surface roughness was calculated by measuring at 20 nm pitch in a range of 10 μm×10 μm. As a result, the arithmetic mean roughness Ra, the root mean square roughness Rms and the maximum-minimum roughness Rmax of the surface were respectively 3.9 nm, 6.4 nm and 137.7 nm and the surface became a good mirror condition.

From the above results, it was found that, as long as a material can be formed on the Pt (111) electrode so as to be oriented, it is possible to use the material as a base layer. Some of such materials were further examined. As a result, there was an effect when $LaAlO_3$, $SrTiO_3$, $SrRuO_3$, $La_{0.6}Sr_{0.4}FeO_3$, $La_{0.6}Sr_{0.4}CoO_3$ and $KNbO_3$ were used besides $LaNiO_3$ and $NaNbO_3$. In addition, there was an effect by laminating (forming $KNbO_3$ on $LaNiO_3$, etc.) or solidifying (La(Ni, Al) $O_3$, etc.) thereof.

In addition, the top electrode 5 was formed on the piezoelectric layer 8 of the above-mentioned KNN film. Al was selected for a material of the top electrode 5 and a vacuum deposition method was used for the formation. The surface irregularities were evaluated also for the top electrode 5. As a result, it was found that the arithmetic mean roughness Ra, the root mean square roughness Rms and the maximum-minimum roughness Rmax of the surface were respectively 3.0 nm, 5.5 nm and 110.3 nm and the top electrode 5 was sufficiently flat. From this examination, it was confirmed that the surface of the top electrode formed on the upper portion of the flat piezoelectric layer has the substantially same flatness as the piezoelectric layer.

Example 4

In Example 4, it was tried to manufacture the same structure as that of the KNN film on the Pt electrode oriented to (111) in Example 1 by using a substrate other than a Si substrate. In Example 1, a Si substrate is used and a thermal oxide film is formed on an upper portion thereof. Since the thermal oxide film is in an amorphous state, the Pt bottom electrode layer, which is formed on the upper portion of the thermal oxide film and is oriented to Pt (111), does not inherits the crystal structure of the Si substrate. The Pt (111) orientation is a result of self-orientation to a close-packed plane of Pt which is a cubical crystal. From this, it was considered that, regardless of the crystal structure of the substrate, it is possible to form the same structure even on a substrate other than the Si substrate, thus, the examination was carried out. As a result, it was confirmed that the same effect is obtained when the Pt electrode layer of the bottom electrode layer is directly formed on a silica glass substrate, a MgO substrate or a $SrTiO_3$ substrate. In addition, it was found that the same effect is obtained by forming a Si oxide film on a glass substrate, a Ge substrate and a SUS substrate by PE-CVD (Plasma Enhanced Chemical Vapor Deposition; plasma CVD) instead of forming a thermal oxide film in Example 1.

Relation Between Surface Roughness and Piezoelectric Constant

Figure 7:
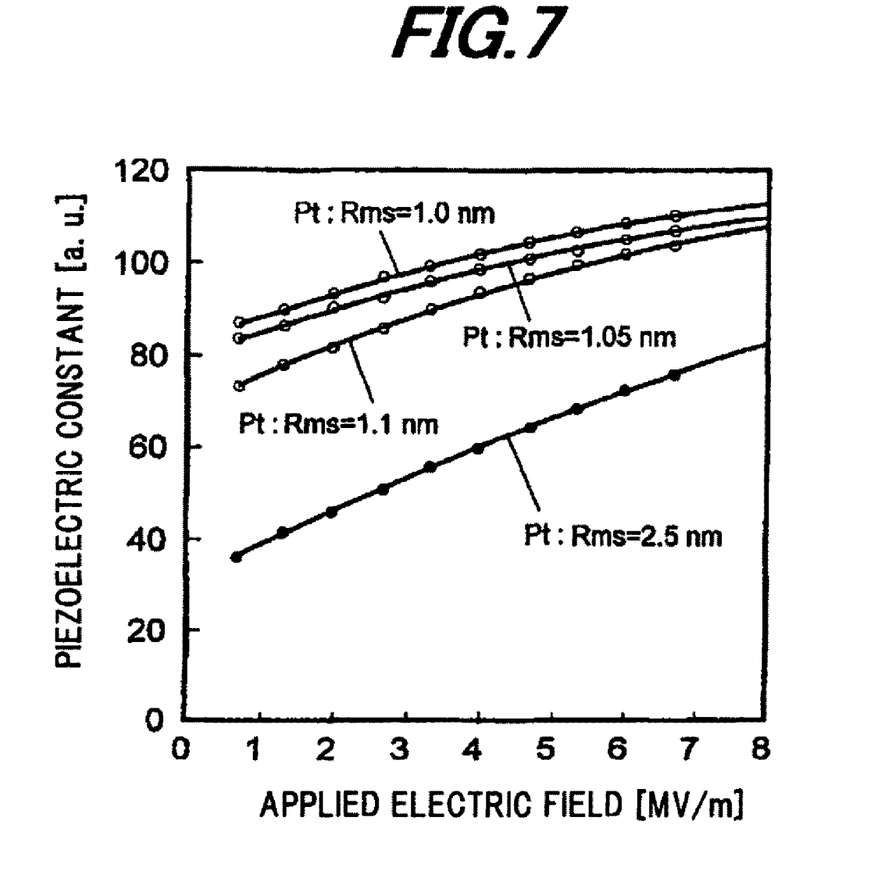
FIG. 7 is a correlation diagram between applied electric field and a piezoelectric constant of the piezoelectric thin film element.

Next, an appropriate value (range) of the piezoelectric layer and the bottom electrode with respect to the effective piezoelectric constant in the KNN piezoelectric thin film element was examined. FIG. 7 is a correlation diagram between each piezoelectric constant and applied electric field of the piezoelectric element of the KNN film formed on the Pt bottom electrode having different surface roughness (the root mean square roughness Rms is shown here). As understood from FIG. 7, the piezoelectric constants of the piezoelectric elements of both KNN films increase with increasing electric field. In addition, what is clear is that, when the surface roughness of the Pt bottom electrode is small (when the surface roughness is reduced), the piezoelectric constant is increased. Particularly, at 6 MV/m of the applied electric field, the piezoelectric constant is about 100 [arbitrary units] when Rms of the Pt bottom electrode is 1.1 nm (Example 1), and the piezoelectric constant is about 70 [arbitrary units] when Rms of the Pt bottom electrode is 2.5 nm (Comparative Example 1).

Here, the reason why the piezoelectric constant is quantified by arbitrary units is as follows. Although a value of Young's modulus or Poisson's ratio, etc., of the piezoelectric layer is required for deriving the piezoelectric constant, it is difficult to derive the value of Young's modulus or Poisson's ratio, etc., of the piezoelectric layer (piezoelectric thin film). Particularly, unlike a bulk body, since a thin film is affected by a substrate used at the time of the film formation (constraint, etc.), it is difficult to derive, in principle, an absolute value (true value) of the Young's modulus or the Poisson's ratio (constant) of the thin film itself Then, the piezoelectric constant is calculated using an estimated value of the Young's modulus or the Poisson's ratio of the KNN film which has been known so far. Therefore, since the obtained piezoelectric constant is an estimate value, the piezoelectric constant is relative arbitrary units in order to be objective. In this regard, however, even though the value of the Young's modulus or the Poisson's ratio of the KNN film used for calculating the piezoelectric constant is an estimate value, it is a reliable value in some degrees, and about 100 [arbitrary units] of the piezoelectric constant can be appropriately 100 [-pm/V] of piezoelectric constant $d_{31}$.

Figure 8A:
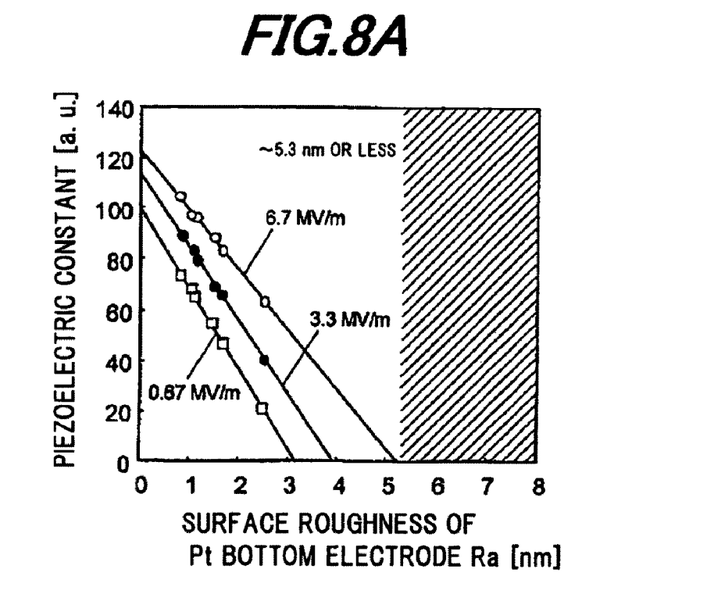
FIGS. 8A and 8B are correlation diagrams between surface roughness and a piezoelectric constant of the Pt bottom electrode.
Figure 8B:
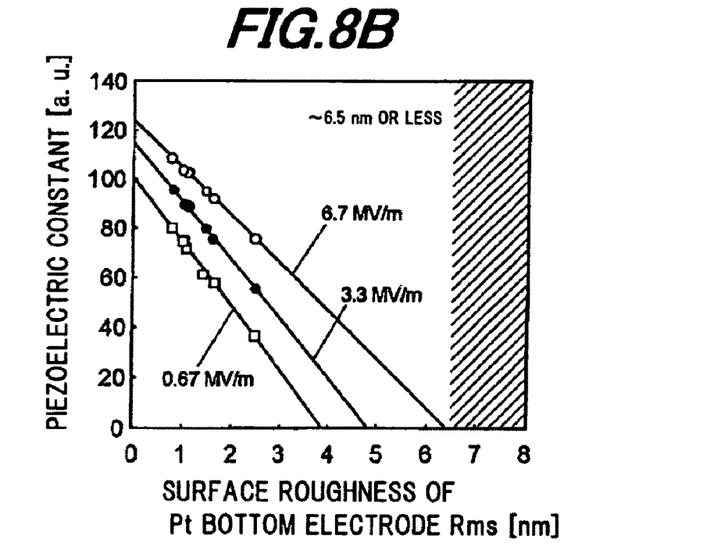
Figure 8C:
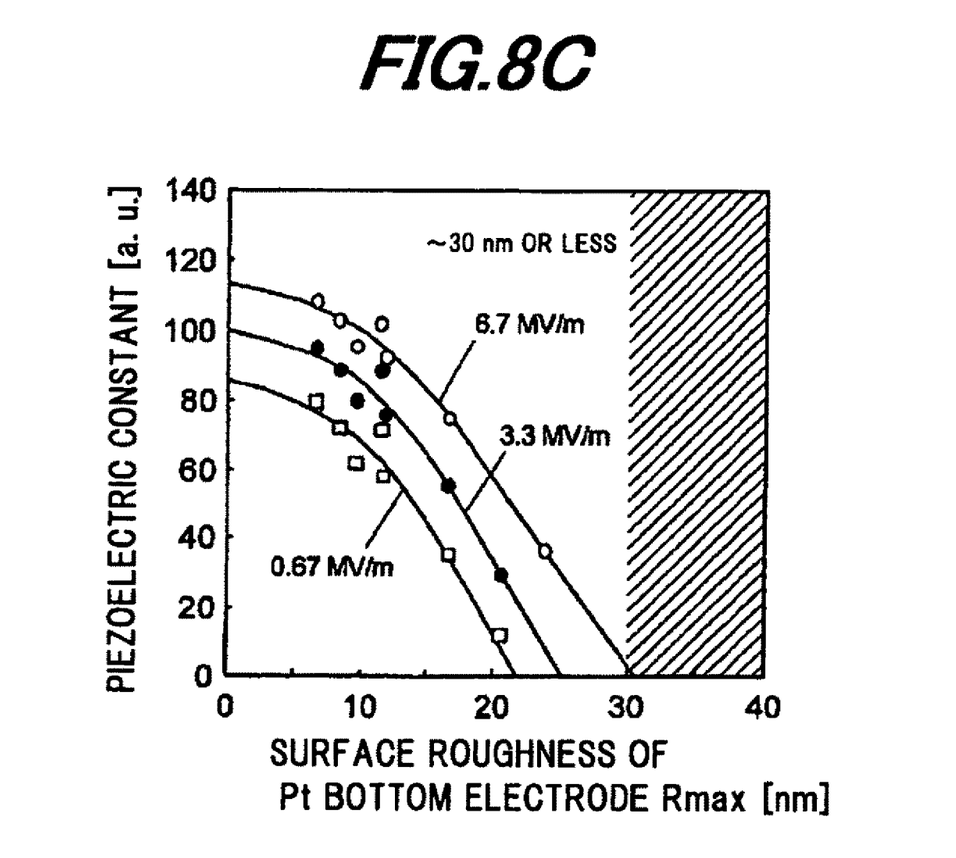
FIG. 8C is a correlation diagram between surface roughness and a piezoelectric constant of the Pt bottom electrode.

In addition, FIGS. 8A, 8B and 8C show correlation diagrams between surface roughness Rms, Ra and Rmax of the Pt bottom electrode and the piezoelectric constant as one of Examples. Horizontal axes in FIGS. 8A, 8B and 8C are the arithmetic mean surface roughness Ra, the root mean square surface roughness Rms and the maximum-minimum roughness Rmax derived by evaluating the surface irregularities using the AFM as mentioned earlier. The unit is nm. As shown in FIGS. 8A to 8C, regardless of magnitude of the applied electric field, the piezoelectric constant increases with decreasing the surface roughness of the Ra, Rms and Rmax. Particularly, at 6.7M of applied electric field, when the arithmetic mean surface roughness Ra becomes 5.3 nm or the root mean square surface roughness Rms becomes 6.5 nm, the piezoelectric constant becomes substantially zero. In FIGS. 8A to 8C, a region where the piezoelectric constant becomes substantially zero is hatched by diagonal lines.

Even if the used applied electric field is about 6.7 MV/m, as understood from FIG. 8A, the surface roughness of the bottom electrode, by which a piezoelectric constant of the same level as the piezoelectric thin film element of the PZT thin film in a prior art such as over 100 [arbitrary units] of the piezoelectric constant can be ensured, is 0.86 nm or less in Ra or 1.1 nm or less in Rms.

Figure 9A:
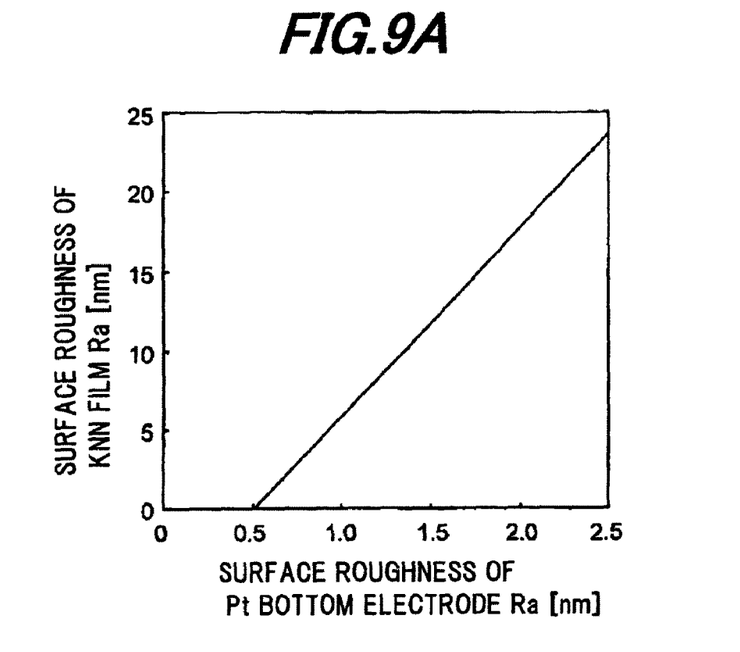
FIGS. 9A and 9B are correlation diagrams between surface roughness of the Pt bottom electrode and surface roughness of the KNN piezoelectric layer formed on an upper portion thereof.
Figure 9B:
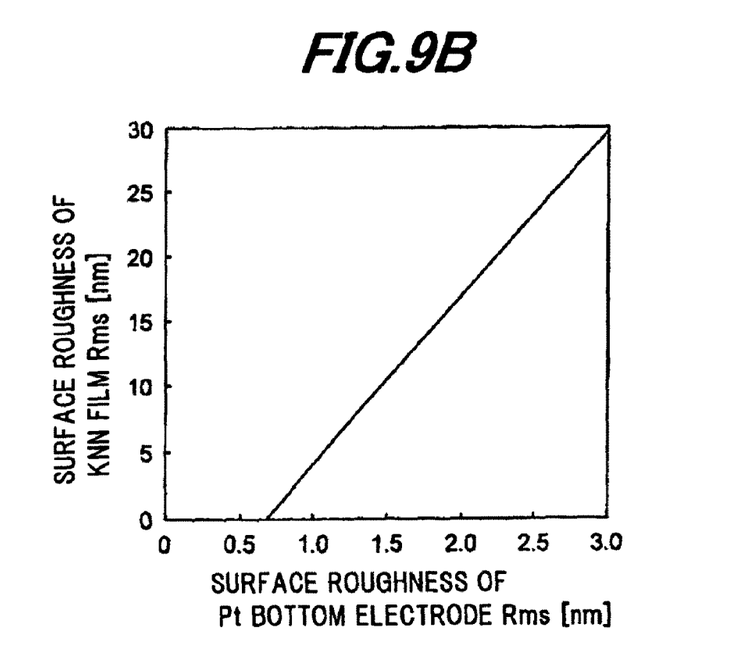

Next, FIGS. 9A and 9B show correlation diagrams between the surface roughness Ra and Rms of the Pt bottom electrode and the surface roughness of the KNN piezoelectric thin film formed on an upper portion thereof. As understood from the figures, the surface roughness of the KNN film is 21 nm when the surface roughness Ra of the Pt bottom electrode is 2.3 nm, however, when the surface roughness Ra of the Pt bottom electrode is small such as 0.68 nm, the surface roughness of the KNN film is 2.0 nm. It is understood that the surface roughness of the KNN thin film increases with increasing the surface roughness of the Pt bottom electrode. In other words, it is possible to decrease the surface roughness of the piezoelectric thin film by reducing the surface roughness of the bottom electrode.

Figure 10A:
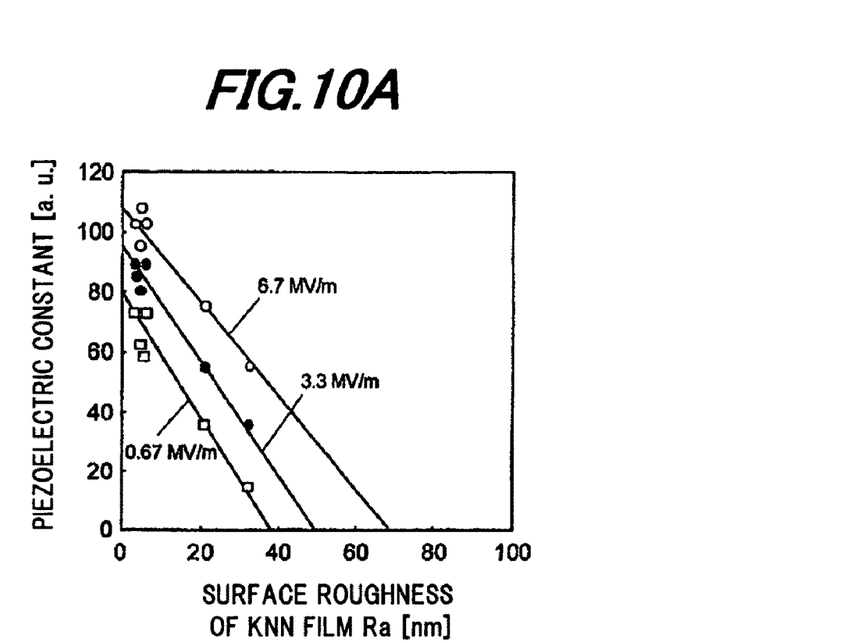
FIGS. 10A and 10B are correlation diagrams between surface roughness and a piezoelectric constant of a surface of the piezoelectric layer.
Figure 10B:
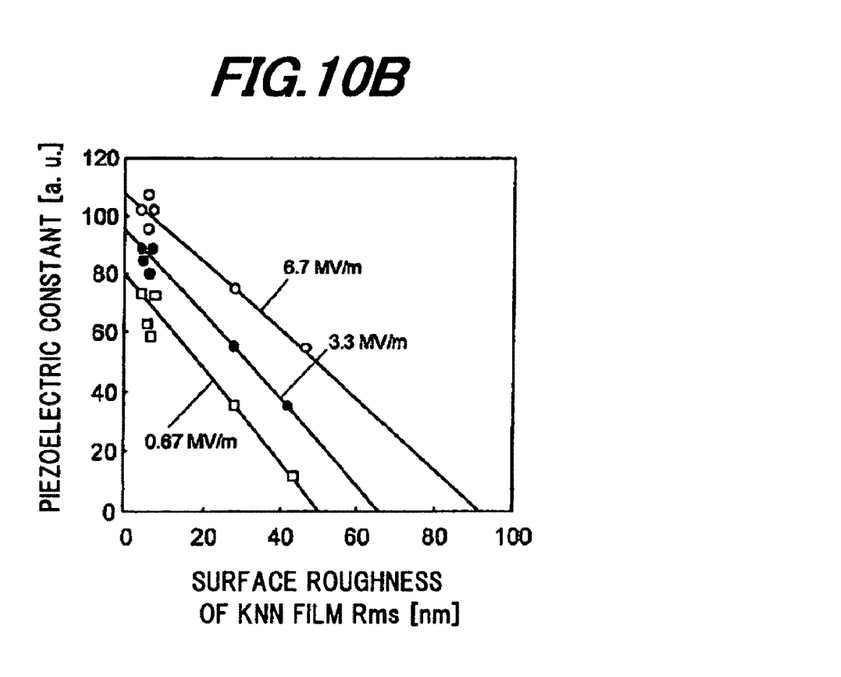

FIGS. 10A and 10B show correlation diagrams between arithmetic mean surface roughness Ra and the root mean square surface roughness Rms of the KNN thin film and the piezoelectric constant as one of Examples. As shown in the figures, regardless of magnitude of the applied electric field, the piezoelectric constant increases with decreasing the surface roughness of the KNN thin film. Conversely, the piezoelectric constant decreases with increasing the surface roughness Rms and Ra. It is possible to manufacture a piezoelectric element with performance required for various devices by appropriately controlling the surface roughness of the Pt bottom electrode layer and the KNN thin film. In addition, it is necessary to increase or decrease the film thickness depending on devices from a viewpoint of controlling an elemental strength, etc.

Figure 11A:
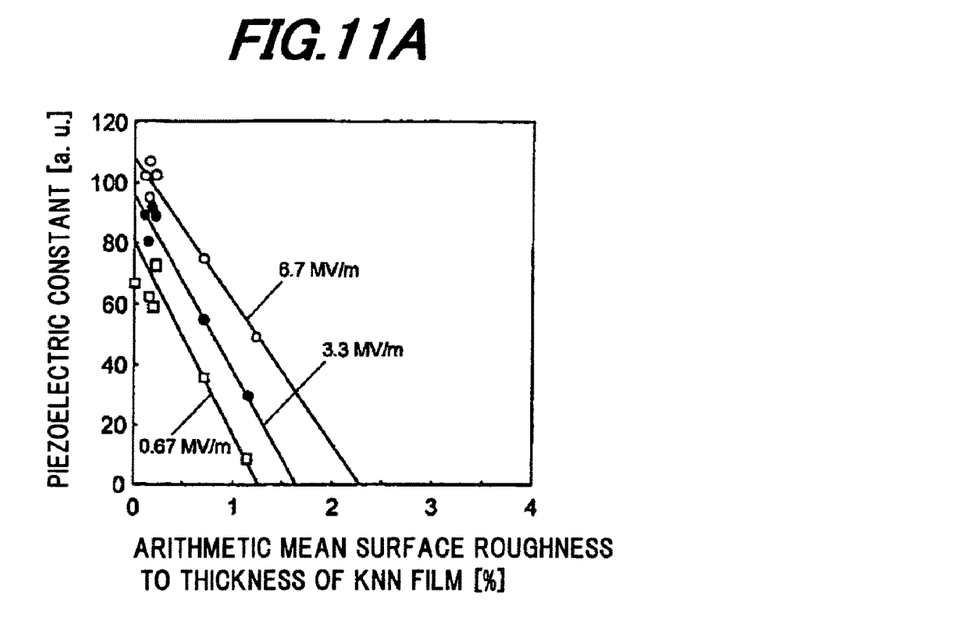
FIGS. 11A and 11B are correlation diagrams between a relative value of the surface roughness with respect to an average film thickness and a piezoelectric constant of the piezoelectric layer.
Figure 11B:
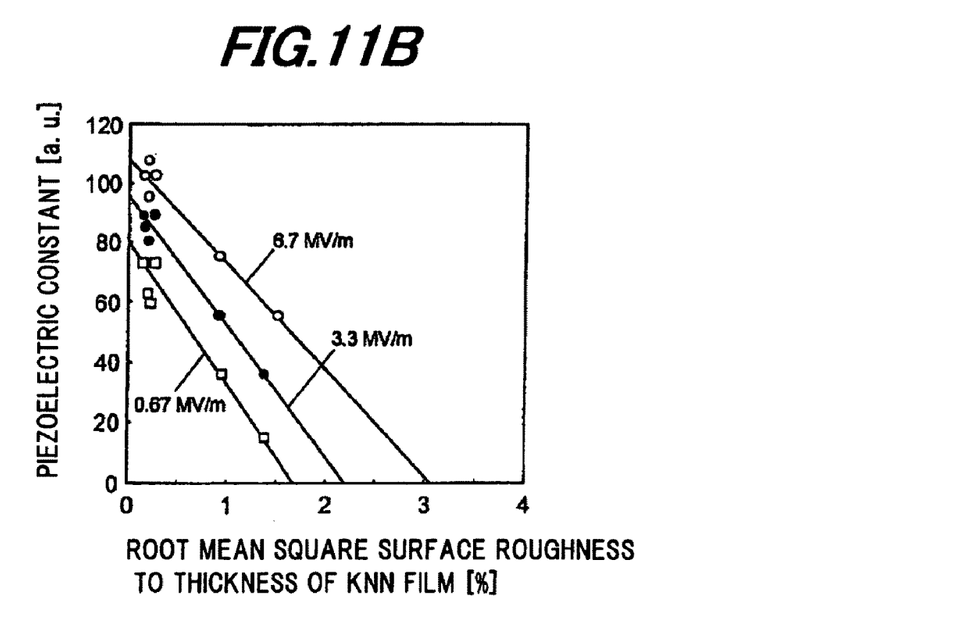

FIGS. 11A and 11B are correlation diagrams between a relative value (unit: %) of the arithmetic mean roughness Ra and the root mean square roughness Rms with respect to an average film thickness of the KNN thin film and a piezoelectric constant of the KNN piezoelectric thin film element. At 6.7 MV/m of applied electric field, when the relative value of the arithmetic mean surface roughness Ra with respect to the film thickness becomes about 2.3% or the relative value of the root mean square surface roughness Rms becomes about 3.1%, the piezoelectric constant becomes substantially zero. In other words, if it is considered that the mainly used applied electric field is about 7 MV/m, the average surface roughness Ra and Rms with respect to the film thickness of the KNN thin film, by which a desired piezoelectric constant in the invention can be ensured, is about 2.7% or less.

Figure 12:
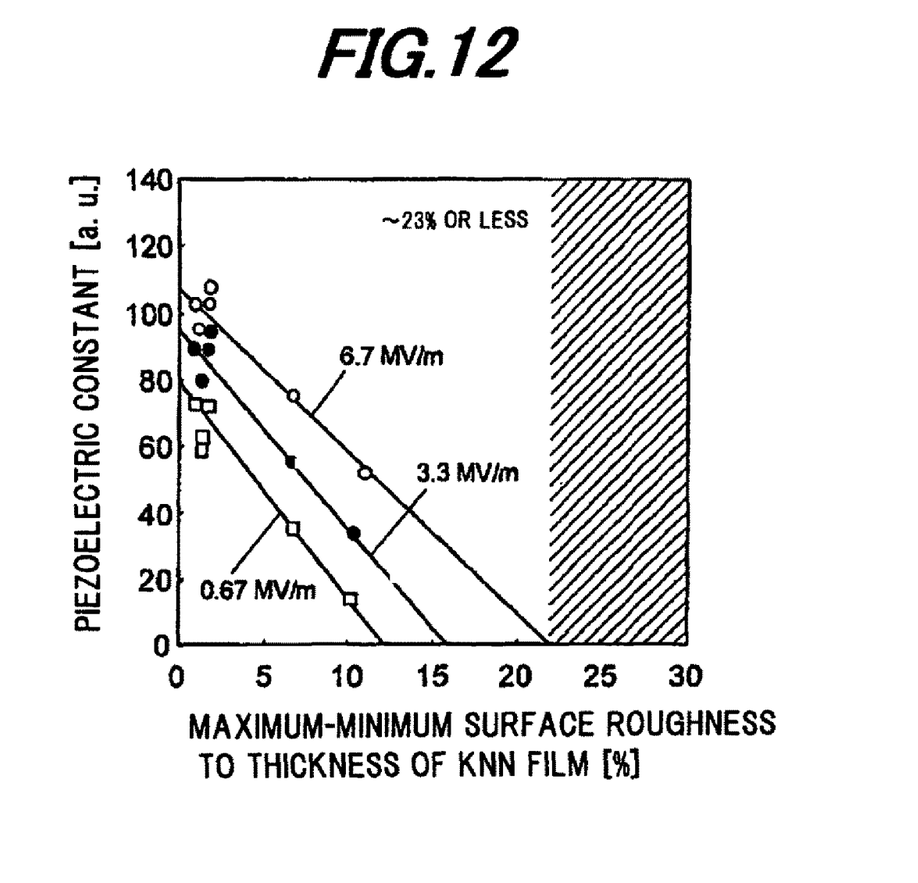
FIG. 12 is a correlation diagram between a relative value of maximum-minimum surface roughness with respect to an average film thickness and a piezoelectric constant of the piezoelectric layer.

Furthermore, FIG. 12 is a correlation diagram between a relative value (unit: %) of maximum-minimum roughness Rmax with respect to the average film thickness of the KNN thin film and a piezoelectric constant of the KNN piezoelectric thin film element. As shown in the figures, regardless of magnitude of the applied electric field, the piezoelectric constant increases with decreasing the relative surface roughness of the KNN thin film. When it is considered that the used applied electric field is about 7 My/m, the relative surface roughness of the KNN thin film, by which a desired piezoelectric constant in the invention can be ensured, is about 23% or less. In FIG. 12, a region where the piezoelectric constant becomes zero is hatched by diagonal lines.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A piezoelectric thin film element, comprising a bottom electrode, a piezoelectric layer, and a top electrode on a substrate,
   wherein the piezoelectric layer comprises, as a main phase, a perovskite-type oxide represented by $(Na_xK_yLi_z)NbO_3$ ($0 \leq x \leq 1$, $0 \leq y \leq 1$, $0 \leq z \leq 0.2$, $x+y+z=1$), and
   wherein the bottom electrode has a surface roughness of not more than 1.1 nm in root mean square roughness Rms.

2. The piezoelectric thin film element according to claim 1, wherein the bottom electrode has a (111) preferential orientation in a direction perpendicular to the substrate.

3. The piezoelectric thin film element according to claim 1, wherein the bottom electrode comprises a bonding layer on the substrate and an electrode layer on the bonding layer, and
   wherein the bonding layer comprises a Ti film of not less than 0.084 nm and not more than 10 nm in thickness.

4. The piezoelectric thin film element according to claim 1, wherein the piezoelectric layer further comprises an $ABO_3$ crystal layer, an $ABO_3$ amorphous layer, or a mixed layer comprising a crystal and an amorphia of $ABO_3$, where A comprises at least one element selected from Li, Na, K, Pb, La, Sr, Nd, Ba, and Bi, B comprises at least one element selected from Zr, Ti, Mn, Mg, Nb, Sn, Sb, Ta, and In, and O is oxygen.

5. The piezoelectric thin film element according to claim 1, wherein the piezoelectric layer has a (001) preferential orientation in a direction perpendicular to the substrate.

6. A piezoelectric actuator, comprising:
   a piezoelectric thin film element according to claim 1; and
   a voltage application unit which applies a voltage to the piezoelectric thin film element.

7. A piezoelectric sensor, comprising:
   a piezoelectric thin film element according to claim 1; and
   a voltage detecting unit which detects a voltage generated at the piezoelectric thin film element.

8. A piezoelectric thin film element, comprising a bottom electrode, a piezoelectric layer, and a top electrode on a substrate,
   wherein the piezoelectric layer comprises, as a main phase, a perovskite-type oxide represented by $(Na_xK_yLi_z)NbO_3$ ($0 \leq x \leq 1$, $0 \leq y \leq 1$, $0 \leq z \leq 0.2$, $x+y+z=1$),
   wherein the bottom electrode has a surface roughness of not more than 0.86 nm in arithmetic mean roughness Ra or not more than 1.1 nm in root mean square roughness Rms, and
   wherein the piezoelectric layer formed on the bottom electrode has a maximum-minimum surface roughness of not more than 23% with respect to an average film thickness of the piezoelectric layer.

9. A piezoelectric thin film element, comprising a bottom electrode, a piezoelectric layer, and a top electrode on a substrate,
   wherein the piezoelectric layer comprises, as a main phase, a perovskite-type oxide represented by $(Na_xK_yLi_z)NbO_3$ ($0 \leq x \leq 1$, $0 \leq y \leq 1$, $0 \leq z \leq 0.2$, $x+y+z=1$),
   wherein the bottom electrode has a surface roughness of not more than 0.86 nm in arithmetic mean roughness Ra or not more than 1.1 nm in root mean square roughness Rms, and
   wherein the piezoelectric layer formed on the bottom electrode has an arithmetic mean surface roughness Ra or root mean square surface roughness Rms of not more than 2.7% with respect to an average film thickness of the piezoelectric layer.

10. A piezoelectric thin film element, comprising a bottom electrode, a piezoelectric layer, and a top electrode on a substrate,
wherein the piezoelectric layer comprises, as a main phase, a perovskite-type oxide represented by $(Na_xK_yLi_z)NbO_3$ ($0 \leq x \leq 1$, $0 \leq y \leq 1$, $0 \leq z \leq 0.2$, $x+y+z=1$),
wherein the bottom electrode has a surface roughness of not more than 0.86 nm in arithmetic mean roughness Ra or not more than 1.1 nm in root mean square roughness Rms, and
wherein the piezoelectric layer has a surface roughness of not more than 4.1 nm in arithmetic mean roughness Ra, not more than 4.8 nm in root mean square roughness Rms, or not more than 137.7 nm in a maximum-minimum roughness.

11. A piezoelectric thin film element, comprising a bottom electrode, a piezoelectric layer, and a top electrode on a substrate,
wherein the piezoelectric layer comprises, as a main phase, a perovskite-type oxide represented by $(Na_xK_yLi_z)NbO_3$ ($0 \leq x \leq 1$, $0 \leq y \leq 1$, $0 \leq z \leq 0.2$, $x+y+z=1$), and
wherein the piezoelectric layer formed on the bottom electrode has a maximum-minimum surface roughness of not more than 23% with respect to an average film thickness of the piezoelectric layer.

12. A piezoelectric thin film element, comprising a bottom electrode, a piezoelectric layer, and a top electrode on a substrate,
wherein the piezoelectric layer comprises, as a main phase, a perovskite-type oxide represented by $(Na_xK_yLi_z)NbO_3$ ($0 \leq x \leq 1$, $0 \leq y \leq 1$, $0 \leq z \leq 0.2$, $x+y+z=1$), and
wherein the piezoelectric layer formed on the bottom electrode has an arithmetic mean surface roughness Ra or root mean square surface roughness Rms of not more than 2.7% with respect to an average film thickness of the piezoelectric layer.

13. A piezoelectric thin film element, comprising a bottom electrode, a piezoelectric layer, and a top electrode on a substrate,
wherein the piezoelectric layer comprises, as a main phase, a perovskite-type oxide represented by $(Na_xK_yLi_z)NbO_3$ ($0 \leq x \leq 1$, $0 \leq y \leq 1$, $0 \leq z \leq 0.2$, $x+y+z=1$), and
wherein the piezoelectric layer has a surface roughness of not more than 4.1 nm in arithmetic mean roughness Ra, not more than 4.8 nm in root mean square roughness Rms, or not more than 137.7 nm in a maximum-minimum roughness.

* * * * *